United States Patent
Plumhoff et al.

(10) Patent No.: US 7,867,403 B2
(45) Date of Patent: Jan. 11, 2011

(54) TEMPERATURE CONTROL METHOD FOR PHOTOLITHOGRAPHIC SUBSTRATE

(76) Inventors: Jason Plumhoff, 12690 Pine Way Dr., Largo, FL (US) 33773; Larry Ryan, 7741 52nd St. North, Pinellas Park, FL (US) 33781; John Nolan, 333 R 78th Ave., St. Pete Beach, FL (US) 33706; David Johnson, 920 Belted Kingfisher Dr., Palm Harbor, FL (US) 34683; Russell Westerman, 12629 96th St. North, Largo, FL (US) 33773

(*) Notice: Subject to any disclaimer, the term of this patent is extended or adjusted under 35 U.S.C. 154(b) by 721 days.

(21) Appl. No.: 11/756,074

(22) Filed: May 31, 2007

(65) Prior Publication Data
US 2008/0149597 A1    Jun. 26, 2008

Related U.S. Application Data

(60) Provisional application No. 60/811,139, filed on Jun. 5, 2006.

(51) Int. Cl.
*B44C 1/22* (2006.01)
*C25F 3/00* (2006.01)

(52) U.S. Cl. ............... 216/12; 216/67; 430/5
(58) Field of Classification Search ............ 216/84, 216/86; 328/745
See application file for complete search history.

(56) References Cited

U.S. PATENT DOCUMENTS

| | | | |
|---|---|---|---|
| 3,993,509 A | 11/1976 | McGinty | |
| 5,290,381 A | 3/1994 | Nozawa et al. | |
| 5,354,416 A | 10/1994 | Okudaira et al. | |
| 5,536,320 A | 7/1996 | Ushikawa et al. | |
| 5,607,009 A | 3/1997 | Turner et al. | |
| 5,609,720 A | 3/1997 | Lenz et al. | |
| 5,711,851 A * | 1/1998 | Blalock et al. | 438/5 |
| 5,902,088 A | 5/1999 | Fairbairn et al. | |
| 6,108,937 A | 8/2000 | Raaijmakers | |
| 6,209,220 B1 | 4/2001 | Raaijmakers | |

(Continued)

FOREIGN PATENT DOCUMENTS

EP    0 790 642 A    8/1997

(Continued)

OTHER PUBLICATIONS

Tachi et al. "Low-temperature dry etching", JVST A 9 (3) May/Jun. 1991 pp. 796-803.

(Continued)

*Primary Examiner*—Roberts Culbert
(74) *Attorney, Agent, or Firm*—Harvey S. Kauget; Phelps Dunbar LLP

(57) ABSTRACT

The present invention provides a method for processing a photolithographic substrate, comprising the placement of the photolithographic substrate on a support member in a chamber wherein the photolithographic substrate has an initial temperature of about zero degrees Celsius to about fifty degrees Celsius. A heat transfer fluid is introduced into the chamber to cool the photolithographic substrate to a target temperature of less than about zero degrees Celsius to less than about minus forty degrees Celsius. The cooled photolithographic substrate is subjected to a plasma process before the temperature of the cooled photolithographic substrate reaches the initial temperature.

20 Claims, 3 Drawing Sheets

U.S. PATENT DOCUMENTS

| | | |
|---|---|---|
| 6,276,072 B1 | 8/2001 | Morad et al. |
| 6,357,143 B2 | 3/2002 | Morad et al. |
| 6,360,132 B2 | 3/2002 | Lin et al. |
| 6,376,387 B2 | 4/2002 | Carlson et al. |
| 6,408,537 B1 | 6/2002 | Aswad |
| 6,410,451 B2 | 6/2002 | Nguyen et al. |
| 6,471,037 B1 | 10/2002 | Matsumoto |
| 6,477,787 B2 | 11/2002 | Morad et al. |
| 6,541,376 B2 | 4/2003 | Inada et al. |
| 6,560,896 B2 | 5/2003 | Granneman et al. |
| 6,578,287 B2 | 6/2003 | Aswad |
| 6,658,763 B2 | 12/2003 | Morad et al. |
| 6,759,334 B2 | 7/2004 | Matsumoto |
| 6,877,250 B2 | 4/2005 | Granneman et al. |
| 6,908,865 B2 | 6/2005 | Kranz et al. |
| 6,957,690 B1 | 10/2005 | Raaijmakers |
| 6,969,863 B2 | 11/2005 | Foth |
| 7,147,720 B2 | 12/2006 | Aggarwal et al. |
| 7,156,924 B2 | 1/2007 | Renken |
| 7,166,187 B2 | 1/2007 | Shajii et al. |
| 7,182,122 B2 | 2/2007 | Koguchi et al. |
| 7,186,313 B2 | 3/2007 | Mitrovic et al. |
| 2002/0116836 A1 | 8/2002 | Morad et al. |
| 2003/0077912 A1 | 4/2003 | Matsumoto |
| 2003/0131495 A1 | 7/2003 | Morad et al. |
| 2004/0035847 A1 | 2/2004 | Gat |
| 2004/0053514 A1 | 3/2004 | Shajii et al. |
| 2004/0154185 A1 | 8/2004 | Morad et al. |
| 2005/0183854 A1 | 8/2005 | Gat |
| 2006/0043318 A1 | 3/2006 | Kodera |
| 2006/0127067 A1 | 6/2006 | Wintenberger et al. |
| 2006/0160253 A1 | 7/2006 | Kim et al. |
| 2006/0160365 A1 | 7/2006 | Wang |

FOREIGN PATENT DOCUMENTS

| | | | | |
|---|---|---|---|---|
| JP | 02229429 A | * | 9/1990 | |
| JP | 04005659 A | * | 1/1992 | |
| JP | 06338450 A | * | 12/1994 | |
| WO | WO 2007/070349 | | 6/2007 | |

OTHER PUBLICATIONS

Bell "Plasma etching of chrome masks using PBS resist", SPIE vol. 1264 (1990) pp. 446-451.

Kang et al. "Etch Characteristics of Cr by Using Cl2/O2 Gas Mixtures with Electron Cyclotron Resonance Plasma", J ECS, 148 (5) pp. G237-G240 (2001).

Marumoto et. al. "Fine Pattern Etching of W-Ti Absorber for X-Ray Mask with Electron Cyclotron Resonance Discharge Plasmas", Jpn, J. Appl. Phys. vol. 32 (1993) pp. 5918-5923.

* cited by examiner

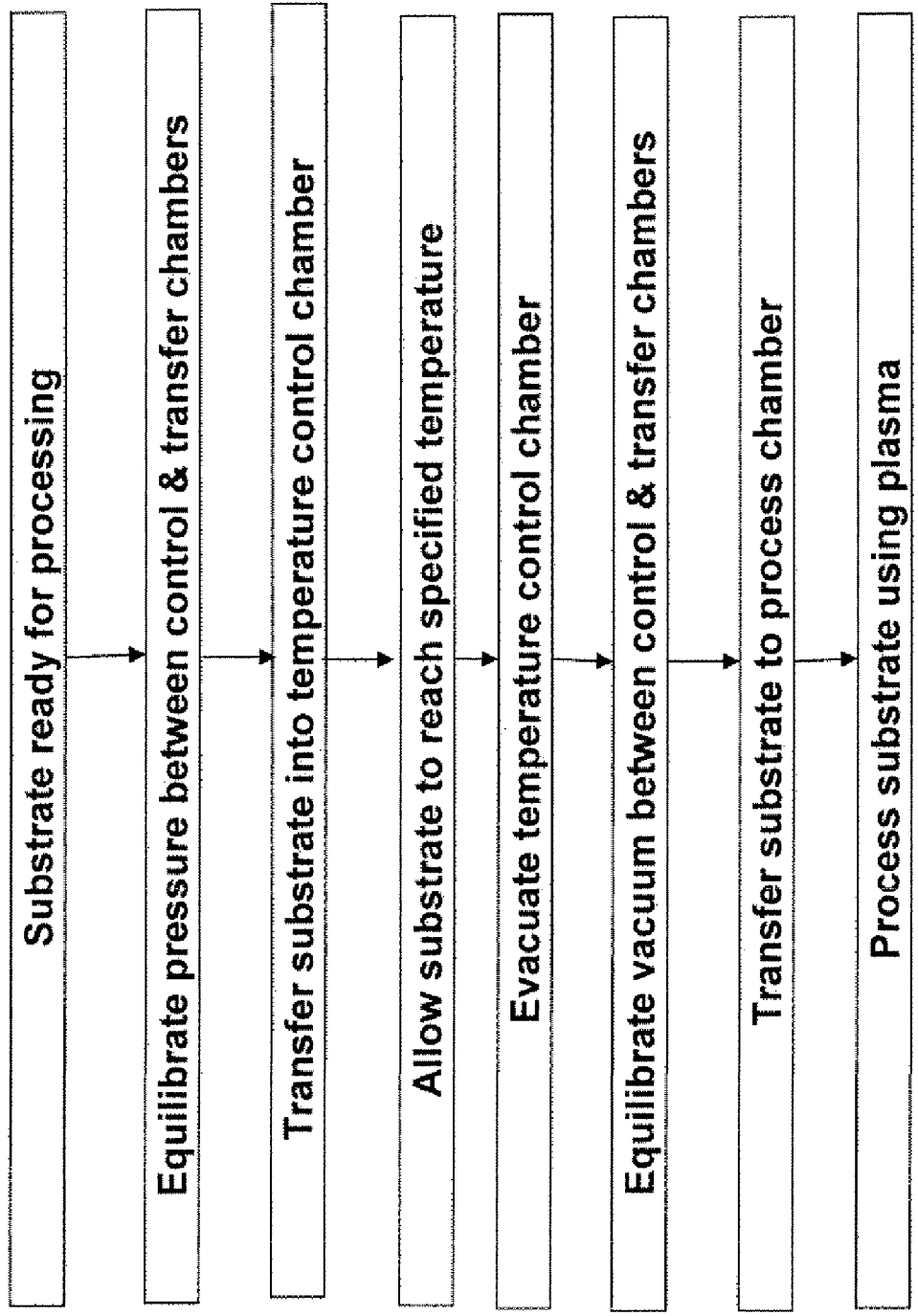

TEMPERATURE CONTROL METHOD FOR PHOTOLITHOGRAPHIC SUBSTRATE

CROSS REFERENCES TO RELATED APPLICATIONS

This application claims priority from and is related to commonly owned U.S. Provisional Patent Application Ser. No. 60/811,139 filed Jun. 5, 2006, entitled: Temperature Control Method for Photolithographic Substrate, this Provisional patent application incorporated by reference herein.

FIELD OF THE INVENTION

The invention relates to the fabrication of integrated circuits and to the fabrication of photomasks useful in the manufacture of integrated circuits.

BACKGROUND

In order to improve device performance, semiconductor device circuit densities continue to increase. This increase in circuit density is realized by decreasing feature sizes. Current technologies target feature sizes of 0.15 µm and 0.13 µm with further decreases expected in the near future.

The exact dimensions of features within the devices are controlled by all steps in the fabrication process. Vertical dimensions are controlled by doping and layering processes where as horizontal dimensions are determined primarily by photolithographic processes. The horizontal widths of the lines and spaces that make up the circuit patterns are often referred to as critical dimensions (CD).

Photolithography is the technique used to form the precise circuit patterns on the substrate surface. These patterns are transferred into the wafer structure by a subsequent etch or deposition process. Ideally, the photolithography step creates a pattern that exactly matches the design dimensions (correct CD) at the designed locations (known as alignment or registration).

Photolithography is a multi-step process where the desired pattern is first formed on a photomask (or reticle). The pattern is transferred to the substrate through a photomasking operation where radiation (e.g., UV light) is transmitted through the patterned photomask exposing a radiation sensitive coating on the substrate. This coating (photoresist) undergoes a chemical change upon exposure to the radiation which renders the exposed areas either more or less soluble to a subsequent develop chemistry. Photolithography techniques are well known in the art. An overview of these techniques can be found in the text of Introduction to Microlithography edited by Thompson et al.

Since the photomask acts as the master for generating the circuit patterns on a large number of substrates, any imperfections introduced during the manufacturing of the photomask will be replicated on all wafers imaged with that photomask. Consequently, fabricating a high quality photomask that faithfully represents the designed patterns and dimensions is critical to creating high yield device manufacturing processes.

There are two major types of photomask reticles that are well known in the art: absorber and phase shifting. An absorber photomask typically consists of an optically transparent substrate (e.g., fused-quartz, $CaF_2$, etc.) that is coated with an opaque film (e.g., Cr). The opaque film may consist a single layer or multiple materials (e.g., an anti-reflective layer (AR chromium) on top of an underlying chromium layer). In the case of binary chromium photomasks, examples of commonly used opaque films (listed by trade name) include, but are not limited to, AR8, NTAR7, NTAR5, TF11, TF21. During fabrication of the photomask, the opaque film is deposited on the transparent substrate. A resist layer is then deposited on top of the opaque layer and patterned (e.g., exposure to a laser or electron beam). Once exposed, the resist layer is then developed exposing areas of the underlying opaque film to be removed. A subsequent etch operation removes the exposed film forming the absorber photomask.

There are two subcategories of phase shifting masks that are well known in the art: alternating and embedded attenuating masks. Alternating phase shift masks typically consist of an optically transparent substrate (e.g., fused-quartz, $CaF_2$, etc.) that is coated with an opaque film (e.g., Cr and antireflective Cr). During fabrication of the photomask, the opaque film is deposited on the transparent substrate. A resist layer is then deposited on top of the opaque layer and patterned using a laser or electron beam. Once exposed, the resist layer is then developed exposing areas of the underlying opaque film to be removed. An etch process removes the exposed opaque film exposing the underlying substrate. A second process is used to etch a precise depth into the underlying substrate. Optionally, the substrate may be subjected to a second resist coat and develop process prior to the second etch process as is known in the art.

Embedded attenuating phase shift masks (EAPSM) typically consist of an optically transparent substrate (e.g., fused-quartz, $CaF_2$, etc.) that is coated with a film or stack of films that attenuate the transmitted light while shifting the phase 180 degrees at a desired wavelength. An opaque film or film stack (e.g., Cr and antireflective Cr) is then deposited on the phase shift material. A resist layer is then deposited on top of the opaque layer and patterned (e.g., using a laser or electron beam). Once exposed, the resist layer is then developed exposing areas of the underlying opaque film to be removed. An etch process is then used to remove the exposed opaque film exposing the underlying phase shifting/attenuating film or film stack. Following etching the opaque film, a second etch process is used to etch the phase shift layer stopping on the underlying substrate. Alternatively, an etch stop layer may be present between the phase shift layer and the substrate, in which case the second etch process will selectively stop at the etch stop layer.

Ideally, the etch process will have a high etch selectivity to both the topmost etch resistant mask (e.g., photoresist, e-beam resist, etc.) and underlying material (substrate or etch stop) while creating features that have smooth vertical side walls that exactly replicate the CD of the original mask (e.g., resist) pattern. Wet etch processes (e.g., aqueous solutions of chloric acid and ceric ammonium nitrite for AR Cr/Cr etch) show good etch selectivity to the etch mask and underlying substrate, but are isotropic and result in significant undercut of the mask which results in sloped feature profiles. The undercut and sloped feature profiles result in changes to the etched feature CD. The undesirable change in CD and/or sloped feature profiles degrade the optical performance of the finished photomask.

Dry etch (plasma) processing is a well known alternative to wet etch processing. Plasma etching provides a more anisotropic etch result than wet process. Dry etching is commonly used in the fabrication of all three mask types.

Dry etching performance is affected by a number of process factors including process gas composition and flow rate, process pressure, applied radio frequency (RF) power—both in the generation of the plasma and as an applied RF bias to the substrate, and substrate surface temperature.

A number of groups have looked at plasma etching of materials at temperatures below 25° C. Etching at reduced temperatures may eliminate undesirable trade-offs seen in near room temperature processes (e.g., improved selectivity to etch mask material while maintaining vertical etch profiles. The benefits of reduced temperature may be realized for most materials: dielectrics, semiconductors, and metals. In the case of etching chromium containing materials, a number of groups have proposed the benefits of plasma etching at reduced temperatures.

In a conventional plasma etch process, the most common method to control the substrate surface temperature is to ensure that the substrate is in intimate contact with a temperature controlled cathode and introducing a pressurized gas between the substrate and the cathode. The substrate is typically held in contact with the cathode using a clamping mechanism which may be accomplished through mechanical or electrostatic means.

In the case of mechanical clamping, a clamping ring applies sufficient force to the substrate to allow the space between the substrate and the cathode to be pressurized with a heat transfer fluid. Mechanically clamped cooling has the benefits of being insensitive to substrate material, and the ease of clamping/declamping the substrate. The limitations of mechanically clamping a substrate however are significant: for example, the presence of the clamp may adversely affect the plasma uniformity. Furthermore, the movement of the clamping mechanism and the physical contact between the clamp and the substrate are prone to cause particle generation. Finally, the area of the substrate that is contacted by the clamp is typically shielded from the plasma environment, resulting in no etching in this region. In the case of reticle fabrication by plasma etch processes, these limitations are not acceptable. Consequently, during fabrication, reticles are not typically mechanically clamped during plasma etching steps.

In an effort to overcome the limitations of mechanical clamps, electrostatic clamping was developed. Electrostatic clamps (ESC) use the attraction of opposite charges instead of a mechanical clamping ring to apply force between the substrate and the cathode. Electrostatic clamping has the advantages of being able to clamp material while only physically touching the back of the substrate. This advantage can translate into improved process uniformity and lower particle levels. However, the ESC configuration also has limitations. Residual charge on the substrate after processing can lead to residual clamping force after the ESC has been de-energized. This residual clamping force can make transferring the substrate after processing difficult. Another limitation of ESCs is their limited ability to clamp dielectric substrates. While it is possible to "clamp through" dielectric substrates to a conductive film on the front side of the substrate, thicker dielectric substrates, such as photolithographic reticles, are typically difficult to electrostatically clamp.

Note that due to the mass of the typical photolithographic substrate that it is possible to introduce a heat transfer gas at low pressures between the substrate and the cathode without clamping (less than about 1 Torr for current 150 mm×150 mm×6 mm quartz photomask substrates). While a low pressure gas will provide limited heat transfer to the substrate, the temperature of the photomask substrate will rise during exposure to plasma.

Due to the defect sensitivity of photolithographic substrates, permissible contact to photomask substrates has been historically limited to approximately the outer 10 mm of the backside of the substrate. This substrate contact constraint has precluded mechanically clamping photolithographic substrates during dry etch processing. Additionally, since the majority of photolithographic substrates are fabricated from dielectric materials (e.g., quartz), electrostatic clamping is typically difficult. Therefore, conventional plasma etch processes during reticle fabrication do not utilize substrate clamping in conjunction with backside cooling.

FIG. 1 shows a typical substrate stage configuration for a photolithographic dry etch system used in reticle fabrication. The substrate 105 is placed on a support cover plate 115. The cover plate 115 may be in thermal contact with the substrate support 120 or thermally isolated. The support cover plate 115 rests on the substrate support 120. The cover plate 115 typically contains a recess that accommodates the substrate 105 such that the top surface of the substrate 105 and cover plate 115 are approximately coplanar. The cover plate 115 contacts the substrate 105 only on the outer edge 110 of the back surface of the substrate 105. The region of contact of the back of the substrate 105 is typically within than the outer 10 mm on the back surface of the substrate 105. The contact between the substrate 105 and the cover plate 115 may be a continuous ledge, point contacts, or some combination thereof. Since the coverplate 115 only contacts the substrate 105 at the outer edges 110 of the rear face, there is typically a thin gap 100 between the back face of the substrate 105 and the substrate support 120.

While the temperature of the substrate support 120 is controlled during the process through contact with a heat transfer fluid (not shown) there is only limited heat transfer between the substrate 105 and the coverplate 115. Therefore, in the absence of helium backside cooling, the photolithographic substrate 105 is subject to heating by the plasma during the dry etch process. The rate of heating during the process is a function of the process parameters, including the RF powers, chamber wall temperatures, etc. The photolithographic substrate 105 is typically not actively cooled during the dry etch process. Consequently, the temperature of the substrate 105 will increase during the time it is exposed to the plasma.

Based on the prior art, there is a need for an improved method to control the temperature of a photolithographic substrate prior to plasma etching during the reticle fabrication process.

Nothing in the prior art provides the benefits attendant with the present invention.

Therefore, it is an object of the present invention to provide an improvement which overcomes the inadequacies of the prior art devices and which is a significant contribution to the advancement to the processing of photomasks and reticles.

Another object of the present invention is to provide a method for processing a photolithographic substrate, comprising placing said photolithographic substrate on a support member in a chamber, said photolithographic substrate having an initial temperature; introducing a heat transfer fluid into said chamber; cooling said photolithographic substrate through said heat transfer fluid to a target temperature; and subjecting said cooled photolithographic substrate to a plasma process before the temperature of said cooled photolithographic substrate reaches said initial temperature.

Yet another object of the present invention is to provide a method for processing a photolithographic substrate, comprising placing said photolithographic substrate on a first support member in a first chamber; introducing a heat transfer fluid into said first chamber; cooling said photolithographic substrate in said first chamber through said heat transfer fluid to a first process set point; transferring said cooled photolithographic substrate out of said first chamber on to a second support member in a second chamber; and subjecting said cooled photolithographic substrate to a plasma process in said second chamber before the temperature of said cooled photolithographic substrate reaches a second process set point.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises a method for improving the etching of a photolithographic substrate by pre-cooling the photolithographic substrate prior to plasma processing.

A feature of the present invention is to provide a method for processing a photolithographic substrate, comprising the placement of the photolithographic substrate on a support member in a chamber. The chamber can be a vacuum chamber. The support member can be a stage that contacts the outer five millimeters of the photolithographic substrate. Or, the stage can contact the photolithographic substrate at three points. The stage can have multiple shelves to hold multiple substrates. The photolithographic substrate is placed on the support member at an initial temperature in the temperature range of about zero degrees Celsius to about fifty degrees Celsius. A heat transfer fluid is introduced into the chamber to cool the photolithographic substrate to a target temperature in the temperature range of less than about zero degrees Celsius to less than about minus forty degrees Celsius, or more preferably to less than about minus thirty degrees Celsius. The heat transfer fluid can be introduced into the chamber so that the pressure rise in the chamber is about one Torr per second. After the pressure in the chamber has reached atmosphere, the introduction of the heat transfer fluid can be increased. The heat transfer fluid can be a dry gas or an inert gas or can include $N_2$. A chamber exhaust can be in operation continuously during the time the heat transfer fluid is introduced into the chamber. The heat transfer fluid can be re-circulated into the chamber. The heat transfer fluid can be cooled prior to its introduction into the chamber. Once the photolithographic substrate has reached the target temperature, the chamber can be evacuated and the cooled photolithographic substrate can be subjected to a plasma process before the temperature of the cooled photolithographic substrate reaches its initial temperature.

Another feature of the present invention is to provide a method for processing a photolithographic substrate, comprising the placement of the photolithographic substrate on a first support member in a first chamber. The first chamber can be a vacuum chamber. The first support member can be a stage that contacts the outer five millimeters of the photolithographic substrate. Or, the stage can contact the photolithographic substrate at three points. The stage can have multiple shelves to hold multiple substrates. The placement of the photolithographic substrate on the first support member can occur at a pressure that is less than atmospheric. A heat transfer fluid is introduced into the first chamber to cool the photolithographic substrate to a first process set point such as a temperature range of less than about zero degrees Celsius to less than about minus forty degrees Celsius, or more preferably to less than about minus thirty degrees Celsius. The heat transfer fluid can be introduced into the first chamber so that the pressure rise in the first chamber is about one Torr per second. After the pressure in the first chamber has reached atmosphere, the introduction of the heat transfer fluid can be increased. The heat transfer fluid can be a dry gas or an inert gas or can include $N_2$. A first chamber exhaust can be in operation continuously during the time the heat transfer fluid is introduced into the first chamber. The heat transfer fluid can be re-circulated into the first chamber. The heat transfer fluid can be cooled prior to its introduction into the first chamber. Once the photolithographic substrate has reached the first process set point, the first chamber can be evacuated. The cooled photolithographic substrate can then be transferred out of the first chamber onto a second support member in a second chamber. This transfer can be performed under vacuum. The second chamber can be a vacuum chamber. The second support member can be a stage that contacts the outer five millimeters of the photolithographic substrate. Or, the stage can contact the photolithographic substrate at three points. The stage can have multiple shelves to hold multiple substrates. The cooled photolithographic substrate is subjected to a plasma process in the second chamber before the temperature of the cooled photolithographic substrate reaches a second process set point such as a temperature range of about zero degrees Celsius to about fifty degrees Celsius.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIG. 3 is a block diagram of the process flow according to the present invention.

Similar reference characters refer to similar parts throughout the several views of the drawings.

DETAILED DESCRIPTION OF THE INVENTION

The present invention provides a method and apparatus to control the temperature of a photolithographic substrate prior to a plasma etch process.

For a typical inductively coupled plasma (ICP) dry etch process for photolithographic substrates, the heat load at the substrate is less than approximately 0.5 $W/cm^2$. Due to the relatively high thermal mass of photolithographic substrates, dry etch processing without active cooling results in minimal temperature rise (typically less than approximately 3° C./minute) during processing. For a typical plasma process used to etch a photolithographic substrate, the total temperature rise is less than approximately 50° C.

Therefore, while it may not be feasible to cool the reticle during the plasma etch process, due to the relatively high thermal mass of a reticle (approximately 220 J/K for a 6"×6"× ¼" quartz photomask) it is possible to plasma etch a reticle such that the reticle temperature is less than 0° C. for at least some portion of a plasma etch process by cooling the mask prior to plasma etching.

Figure 1:
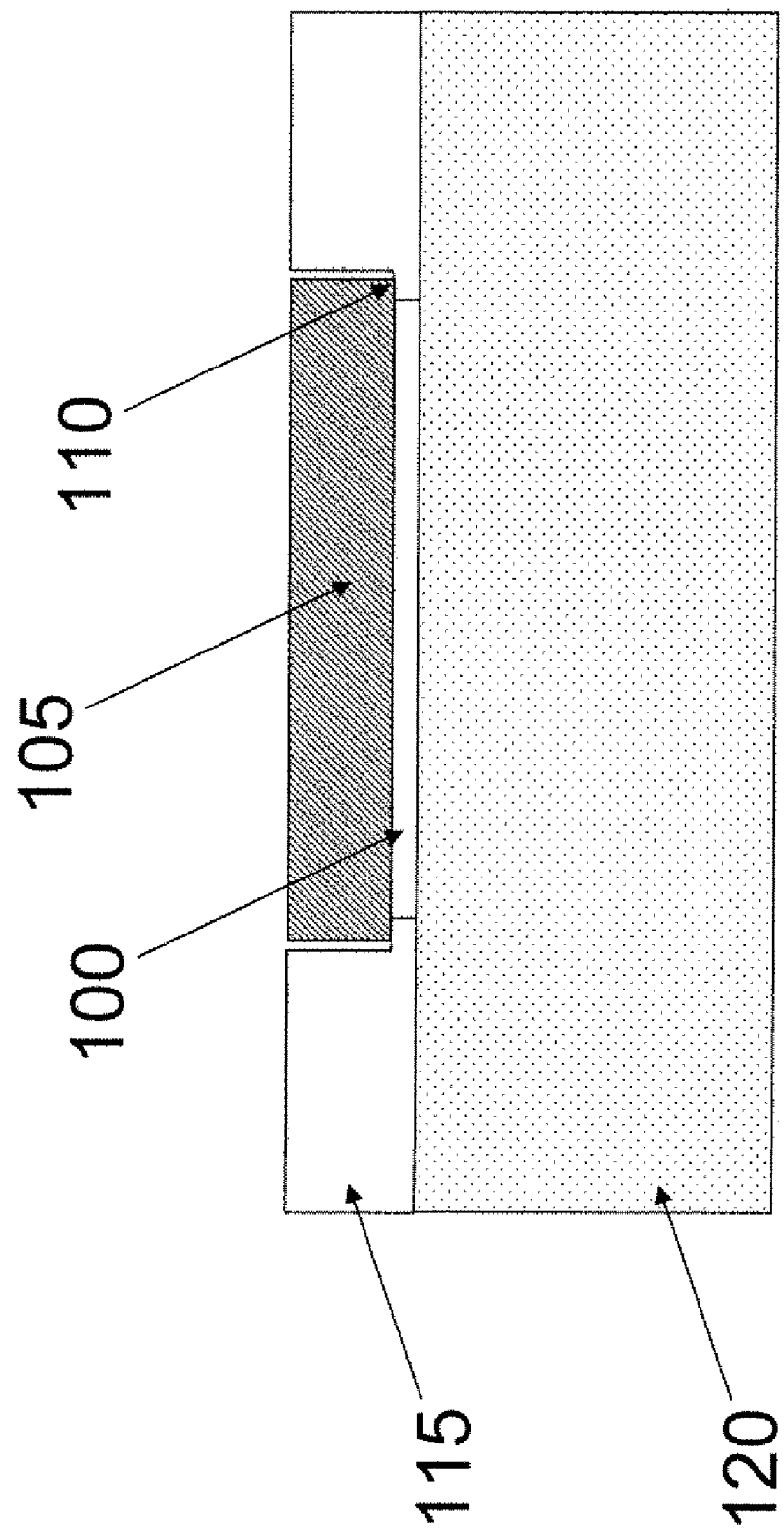
FIG. 1 is a schematic view of a prior art substrate stage configuration for a photolithographic dry etch system used in reticle fabrication.
Figure 2:
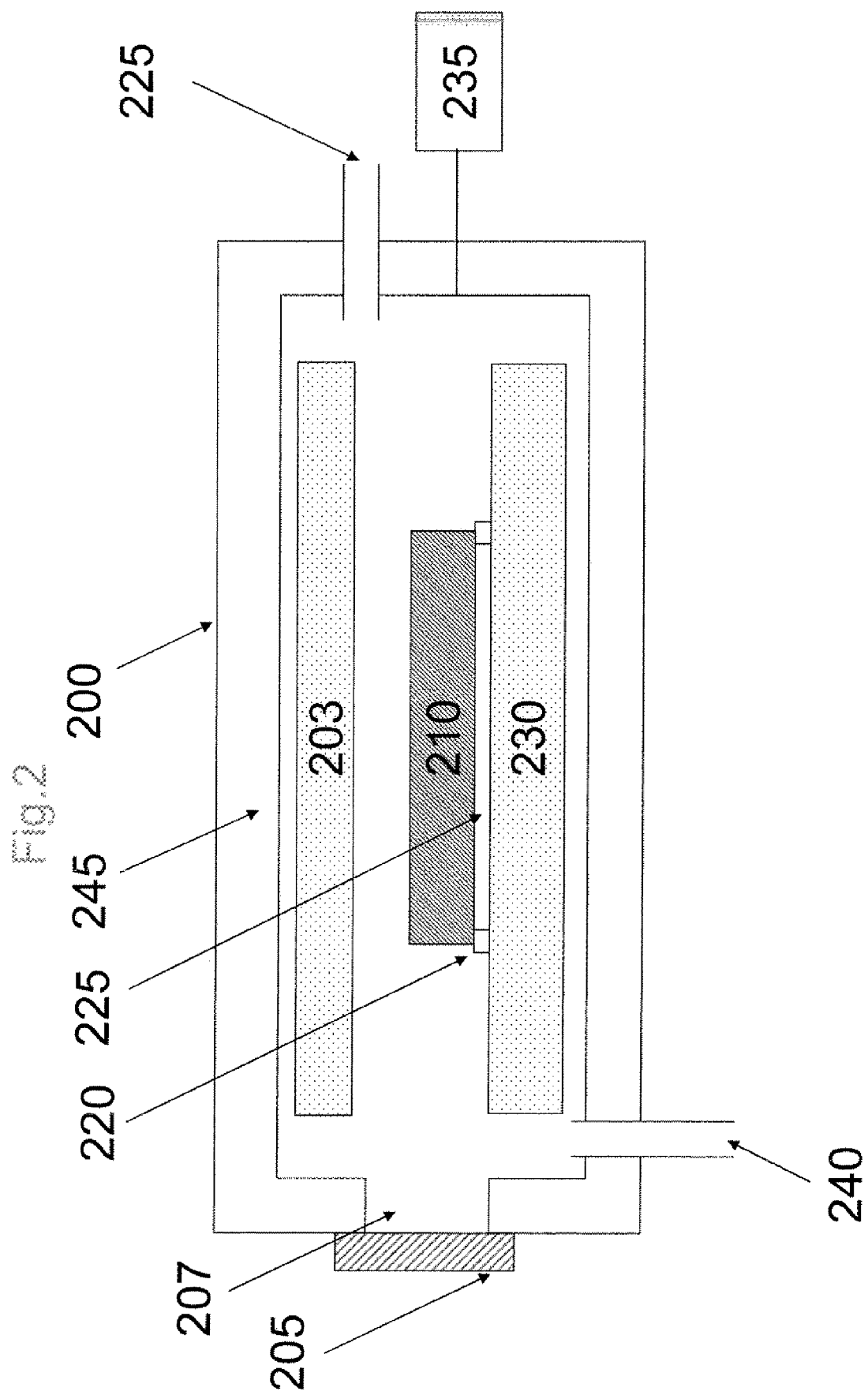
FIG. 2 is a schematic of a processing chamber capable of cooling a photomask reticle prior to exposure to a subsequent process.

FIG. 2 is a schematic of a processing chamber capable of cooling a photomask reticle prior to exposure to a subsequent process. The subsequent process may be a plasma etch process. The processing chamber consists of a vacuum compatible chamber 200 that has at least one opening 207 large enough to accommodate transferring a substrate 210 into the chamber by means of a robot (not shown). Optionally, the opening 207 can be closed by means of a vacuum compatible valve 205. The substrate transfer operation can occur under vacuum or at pressures near atmospheric pressures. The opening 207 is in communication with a transfer chamber (not shown).

The substrate 210 is held above a stage 230 by substrate supports 220. The substrate supports 220 contact the substrate 210 on the outer 5 mm of the backside of the substrate 210. Alternately, the supports 220 may contact the side surfaces of the substrate 210. The substrate support 220 may be one continuous ring around the substrate edge, or discrete supports. In a preferred embodiment, three discrete point contacts support the substrate 210.

The substrate 210 is held in close proximity to a cooled surface 203. In a preferred embodiment, the substrate 210 is held within 10 mm of the cooled surface 203. The cooled surface 203 is held at a temperature less than or equal to the desired temperature of the substrate 210. The cooled surface 203 is held at a predetermined temperature by a cooling unit (not shown). In a preferred embodiment, the stage 230 is a cooled surface. In yet another embodiment, the chamber walls 245 are cooled surfaces.

In order to transfer heat from the cooled surface 203 to the substrate 210, a heat transfer fluid is introduced into the chamber 200 through a fluid input 240. The heat transfer fluid must not leave residues on the substrate 210 during the cooling process. The heat transfer fluid may be an inert gas such as nitrogen, helium or clean dry air. If the fluid is a gas, the dew point of the fluid must be significantly below the temperature of the cooled surface in order to avoid condensation on the substrate or cooled surface.

In an alternate embodiment, the fluid input 240 has no direct line of sight to the substrate.

In yet another embodiment, the fluid is brought into contact with the cooled surface prior to being introduced into the cooling chamber.

The heat transfer fluid may be introduced in a batch mode, a semi-batch mode, or continuously. In the case of batch introduction of the fluid, heat transfer between the substrate 210 and the cooled surface can occur by natural convection or forced convection. In the case of forced convection, the fluid may be re-circulated through the chamber by means of a re-circulating pump (not shown). In the case of continuous introduction of the cooling fluid, the fluid is exhausted through a fluid exhaust 215. Optionally, the cooling fluid may be exhausted through the transfer opening 207.

Note that in an alternate embodiment that the heat transfer fluid may be introduced into the cooling chamber 200 prior to the substrate 210 being transferred into the chamber 200. As before, the heat transfer fluid may be introduced in a batch, semi-batch, or continuous mode.

FIG. 3 shows a block diagram of the process flow. The process starts with a photolithographic substrate at some initial temperature in the transfer chamber with a patterned film or material to be dry etched. The pressure between transfer chamber and the cooling chamber are brought approximately into equilibrium. Once the pressures have been approximately equilibrated, the substrate is transferred into the cooling chamber. The transfer operation may occur at near atmospheric pressure or under vacuum.

The substrate dwells in the cooling chamber until a process set point has been reached. The process set point may be the desired mask temperature, or the set point may be time. In the case where the set point is the substrate temperature, a sensor 235 is used to monitor the substrate temperature. In any case, the temperature of at least some portion of the substrate will decrease as compared to the initial temperature. Note that the pressure of the cooling chamber may be near atmospheric pressure or alternatively below atmospheric pressure. In a preferred embodiment the pressure in the cooling chamber is greater than 10 Torr during the cooling process. The pressure of the cooling chamber may be monitored and held nearly constant during at least some portion of the cooling process.

Alternatively, in order to minimize the initial thermal shock to the substrate during the cooling process, the pressure of the cooling chamber can be started at a pressure below atmospheric pressure and increased at least once during the cooling process.

In a preferred embodiment, the cooling process is completed in less than 30 minutes.

Once the cooling process has reached the process set point, the cooling chamber and the transfer chamber are evacuated. Once the pressure in the cooling chamber and transfer chamber have approximately equilibrated, the substrate is transferred from the cooling chamber into the transfer chamber. The substrate may then be transferred to a plasma processing chamber and be exposed to a plasma. During at least some portion of the plasma process, at least some portion of the substrate is at a temperature below the initial substrate temperature.

Optionally, once the dry etch process has been completed, the substrate may be heated to about 20° C. before being exposed to atmospheric conditions. Heating the substrate prior to atmospheric exposure prevents condensation that may adversely affect the mask performance. The heating step may be performed in the plasma reactor. A plasma heating step may be composed of a reactive gas mixture (e.g., oxygen containing gas mixture to strip remaining etch resist), or a non-reactive gas (e.g., He, Ar, etc.).

In another embodiment, the reticle temperature remains below room temperature (25° C.) for the duration of the etch process by cooling the mask prior to the plasma etch process. This may be accomplished by cooling the mask to a low enough initial temperature to compensate for the temperature rise experienced by the mask during plasma processing.

Alternatively, the temperature of the mask can be monitored during the etch process. If the mask temperature exceeds a predetermined temperature set point, the plasma process is interrupted, and the mask is cooled prior to resuming the etching process. The process of etching and cooling the mask may be repeated as many times as necessary in order to maintain the reticle temperature below the desired temperature value.

While the disclosure above focuses primarily on photolithographic substrates, the method and apparatus may be applied to other substrate types including metal, dielectric, and semiconducting. The method is particularly applicable to substrates with a high thermal mass (e.g., greater than 40 J/K).

An example of high thermal mass substrates are ceramic substrates (e.g., AlTiC, Al$_2$O$_3$, etc.).

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A method for processing a photolithographic substrate, comprising:
    placing said photolithographic substrate on a support member in a processing chamber, said photolithographic substrate having a high thermal mass, said photolithographic substrate having an initial temperature;
    introducing a heat transfer fluid into said processing chamber;
    cooling said photolithographic substrate through said heat transfer fluid to a target temperature; and
    subjecting said cooled photolithographic substrate to a plasma process before the temperature of said cooled photolithographic substrate reaches said initial temperature, said photolithographic substrate having a temperature rise of less than approximately 3 degrees Celsius per minute during said plasma process.

2. The method according to claim 1 wherein said heat transfer fluid is introduced into said chamber at a rate of about one Torr per second.

3. The method according to claim 1 wherein said heat transfer fluid is a dry gas.

4. The method according to claim 1 wherein said heat transfer fluid is an inert gas.

5. The method according to claim 1 wherein said heat transfer fluid contains N$_2$.

6. The method according to claim 1 wherein said support member holds said photolithographic substrate along the outer five millimeters of said photolithographic substrate.

7. The method according to claim 1 wherein said support member holds said photolithographic substrate through three points.

8. The method according to claim 1 wherein said initial temperature has a temperature range of about zero degrees Celsius to about fifty degrees Celsius.

9. The method according to claim 1 wherein said target temperature has a temperature range of less than about zero degrees Celsius to less than about minus forty degrees Celsius.

10. The method according to claim 1 wherein said target temperature has a temperature range of less than about minus thirty degrees Celsius.

11. A method for processing a photolithographic substrate, comprising:
    placing said photolithographic substrate on a support member in a processing chamber, said photolithographic substrate having a thermal mass greater than 220 J/K;
    introducing a heat transfer fluid into said processing chamber;
    cooling said photolithographic substrate in said processing chamber through said heat transfer fluid to a first process set point; and
    subjecting said cooled photolithographic substrate to a plasma process before the temperature of said cooled photolithographic substrate reaches a second process set point.

12. The method according to claim 11 wherein said heat transfer fluid is introduced into said processing chamber at a rate of about one Torr per second.

13. The method according to claim 11 wherein said heat transfer fluid is a dry gas.

14. The method according to claim 11 wherein said heat transfer fluid is an inert gas.

15. The method according to claim 11 wherein said heat transfer fluid contains N$_2$.

16. The method according to claim 11 wherein said support member holds said photolithographic substrate along the outer five millimeters of said photolithographic substrate.

17. The method according to claim 11 wherein said support member holds said photolithographic substrate through three points.

18. The method according to claim 11 wherein said first process set point has a temperature range of less than about zero degrees Celsius to less than about minus forty degrees Celsius.

19. The method according to claim 11 wherein said first process set point has a temperature range of less than about minus thirty degrees Celsius.

20. The method according to claim 11 wherein said second process set point has a temperature range of about zero degrees Celsius to about twenty degrees Celsius.

* * * * *